United States Patent
Hanifah et al.

(10) Patent No.: US 7,250,348 B1
(45) Date of Patent: Jul. 31, 2007

(54) APPARATUS AND METHOD FOR PACKAGING SEMICONDUCTOR DEVICES USING A PATTERNED PHOTO SENSITIVE FILM TO REDUCE STRESS BUFFERING

(75) Inventors: Zabarulla Hanifah, Melaka (MY); Pradeep A/L P. Divakaran, Melaka (MY); Low Chian Inn, Melaka (MY); Lim Leong Heng, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 334 days.

(21) Appl. No.: 10/986,739

(22) Filed: Nov. 12, 2004

(51) Int. Cl.
*H01L 21/8222* (2006.01)
*H01L 21/20* (2006.01)
*H01L 21/8238* (2006.01)
*H01L 29/00* (2006.01)
*H01L 27/102* (2006.01)

(52) U.S. Cl. .............. 438/330; 438/329; 438/384; 438/382; 438/210; 257/528; 257/536; 257/581

(58) Field of Classification Search .......... 438/210, 438/329–330, 382, 384; 257/359, 379–380, 257/528, 536, 581
See application file for complete search history.

(56) References Cited

U.S. PATENT DOCUMENTS

| | | | |
|---|---|---|---|
| 3,562,040 A * | 2/1971 | Garies | 216/108 |
| 5,095,402 A * | 3/1992 | Hernandez et al. | 361/306.2 |
| 6,083,785 A * | 7/2000 | Segawa et al. | 438/238 |
| 6,329,879 B1 * | 12/2001 | Maruyama et al. | 330/289 |
| 6,803,324 B2 * | 10/2004 | Ogawa et al. | 438/761 |
| 2005/0051814 A1 * | 3/2005 | Miyake et al. | 257/288 |

OTHER PUBLICATIONS

"*LAMINAR® GA Dry Film Photopolymer*", 4 Pages, IM00N008, Rev 0., Shipley Company LLC, A Rohm and Haas Company.
Pending U.S. Appl. No. 10/953,002, Low Stress Packaging Methods For Semiconductor Devices, filed Sep. 28, 2004 (Copy not included per Waiver of 37 CFR 1.98).

* cited by examiner

*Primary Examiner*—Luan Thai
(74) *Attorney, Agent, or Firm*—Beyer Weaver LLP

(57) ABSTRACT

A method and apparatus for packaging semiconductor devices using patterned laminate films to reduce stress buffering. The method includes fabricating a semiconductor die having thin film resistors and bond pads formed on an active surface. A film layer is formed onto the active surface of the die, covering the thin film resistors and bond pads. The film layer is then patterned to create recesses in the film layer in the vicinity of the bond pads on the active surface of the die. The die then undergoes wire bonding and is next encapsulated in a molding compound. The film layer between the film resister and the molding compound reduces stress buffering created by the molding compound.

11 Claims, 3 Drawing Sheets

APPARATUS AND METHOD FOR PACKAGING SEMICONDUCTOR DEVICES USING A PATTERNED PHOTO SENSITIVE FILM TO REDUCE STRESS BUFFERING

FIELD OF THE INVENTION

The present application relates to semiconductor packaging, and more particularly, to an apparatus and method of packaging semiconductor devices using patterned photo sensitive films to reduce stress buffering.

BACKGROUND OF THE INVENTION

Semiconductor devices are widely used in a host of applications, ranging from computers, micro-controllers, cell phones and communication devices, wired and wireless data networking, consumer electronics, and many other applications. Semiconductor devices are typically fabricated in wafer form. After fabrication, the wafer is "diced" to signulate the individual die along the scribe lines on the wafer. The individual die are then packaged and tested before being sent to customers or end users.

Semiconductor devices can be encapsulated in a number of different types of packages, such as ball grid arrays, quad flat packs, etc. Many of these packaging types require the die to be encapsulated in a molding compound such as epoxy B. With certain types of die, the use of molding material is problematic because it creates stress on the die. This stress, sometimes referred to as "stress buffering", is caused by physical changes to the compound during the molding and curing process. This phenomena is particularly troublesome with high precision semiconductor devices that are required to sense very low voltages. These devices typically have thin film resistors (TFRs) fabricated thereon and that are used in the sensing of the very low voltages on the die surface. Changes in the resistivity of the thin film resistor caused by the molding process may cause the regulated voltage outputs on the device to vary and not meet device specifications. More specifically, the stress may impact the electrical performance of the device, causing parametric drift and hampering its high precision performance.

A so called "Glob" top packaging technique is one known way of potentially reducing or eliminating the stress buffering situation. With glob top packaging, a ball or glob of stress-free material, such as QI-4939 (silicon gel), is dispensed onto the surface of the die. This material acts as a physical buffer between the thin film resistor and the molding compound. The glob process, however, has a number of drawbacks. Foremost, it is expensive. The glob has to be placed on each individual die, as opposed to applying the material on the wafer level. Thus the process is both time consuming and requires specific or dedicated equipment. It is also difficult to control the height of the glob since it is dispensed onto the die surface. Finally, the glob top packaging technique does not work with all types of package configurations. In some circumstances, the glob interferes with the wire bonding process.

An apparatus and method for packaging semiconductor devices using patterned laminate films to reduce stress buffering is therefore needed.

SUMMARY OF THE INVENTION

To achieve the foregoing, and in accordance with the purpose of the present invention, a method and apparatus for packaging semiconductor devices using patterned laminate films to reduce stress buffering is disclosed. The method includes fabricating a semiconductor die having thin film resistors and bond pads formed on an active surface. A film layer is formed onto the active surface of the die, covering the thin film resistors and bond pads. The film layer is then patterned to create recesses in the film layer in the vicinity of the bond pads on the active surface of the die. The die then undergoes wire bonding and is next encapsulated in a molding compound. The film layer between the film resister and the molding compound reduces stress buffering created by the molding compound.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

Figure 1:
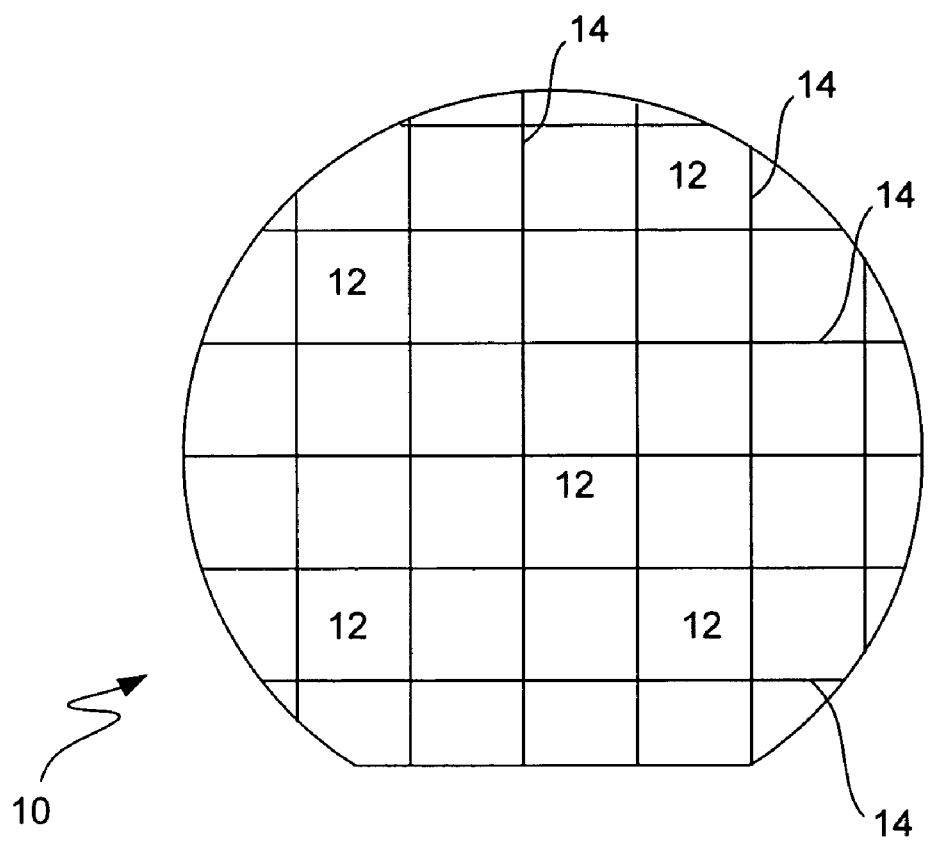
FIG. 1 is a diagram of a semiconductor wafer according to the present invention.

Referring to FIG. 1, a diagram of a semiconductor wafer according to the present invention is shown. The wafer 10 includes a plurality of dice 12 separated from one another by a plurality of horizontal and vertical scribe lines 14.

Figure 2:
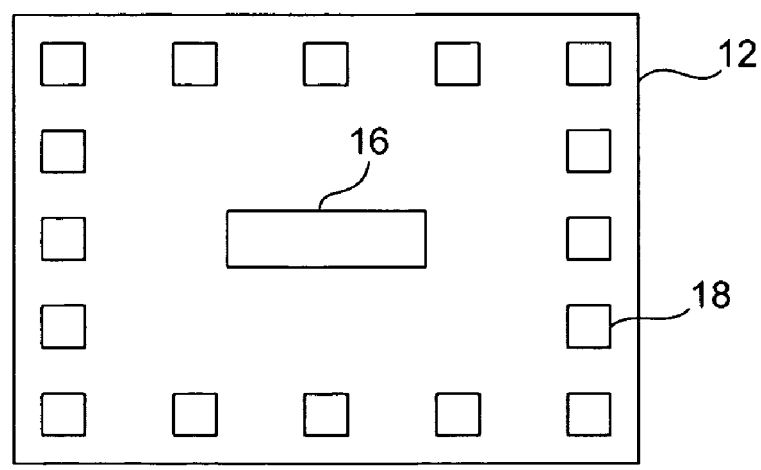
FIG. 2 is a top view of a die from the wafer of the present invention.

Referring to FIG. 2, a top view of a die from the wafer 10 is shown. The die 12 includes a thin film resistor 16 and a plurality of bond pads 18 arranged on the die. As noted in the background, the thin film resistor 16 is a component of the voltage sensing circuitry (not shown) on the die. It should be noted that the die 12 of FIG. 2 is shown for exemplary purposes illustrating the present invention. Generally speaking, each die would typically have numerous thin film resistors 16. For the sake of simplicity, the other circuitry on the die 12 is not shown.

The process flow for reducing stress buffering described below is typically performed at the wafer level. The process, however, is initially described with regard to a single die 12. It should be understood that this same process can be performed at the wafer level.

Figure 3:
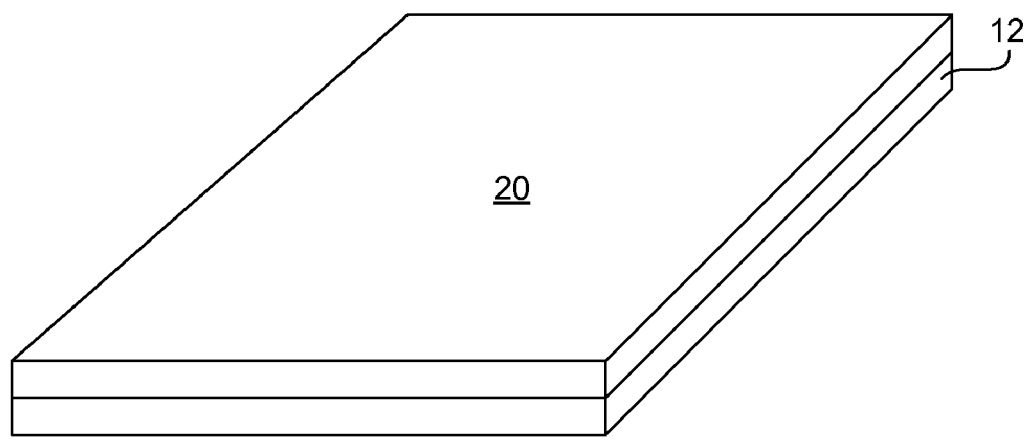
FIG. 3 is a perspective view of a film layer formed on the die of the present invention.

Referring to FIG. 3, a perspective view of a film layer 20 formed on the die 12 is shown. The film layer 20 is a photo resist material applied using well known semiconductor fabrication techniques.

Figure 4:
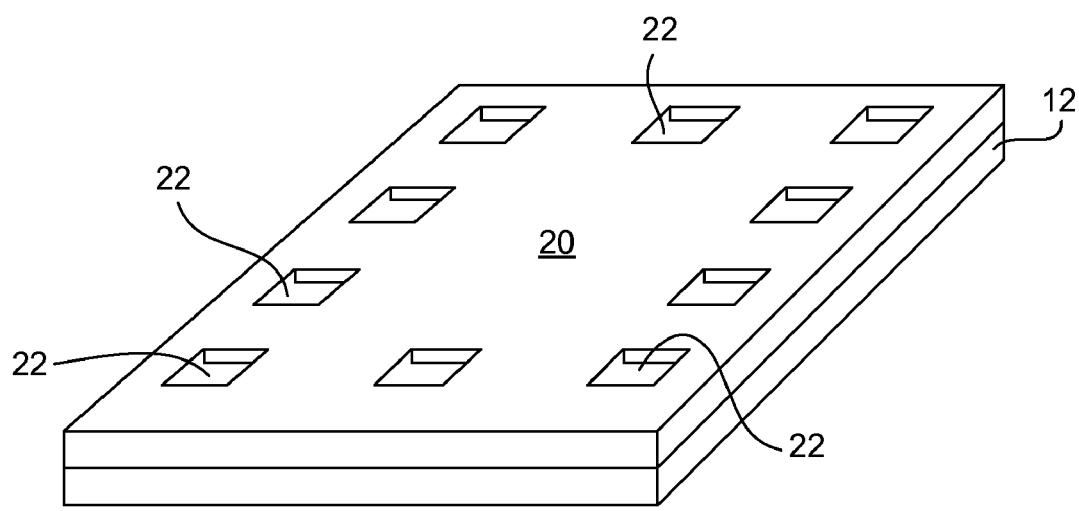
FIG. 4 is a perspective view of the film layer patterned to expose the bond pads on the die of the present invention.

Referring to FIG. 4, another perspective view of the die 12 with the film layer 20 patterned to expose the die pads is shown. In particular, recess regions 22 are formed in the film layer 20. The bond pads 18 are exposed through the recess regions 22.

It should be noted that the diagrams of FIGS. 3 and 4 are not to scale but are drawn as shown for the sake of simplicity. In one embodiment for example, the thickness of the wafer or die 12 is approximately 16 mils thick and the film layer 20 is approximately 3 mils thick.

Figure 5:
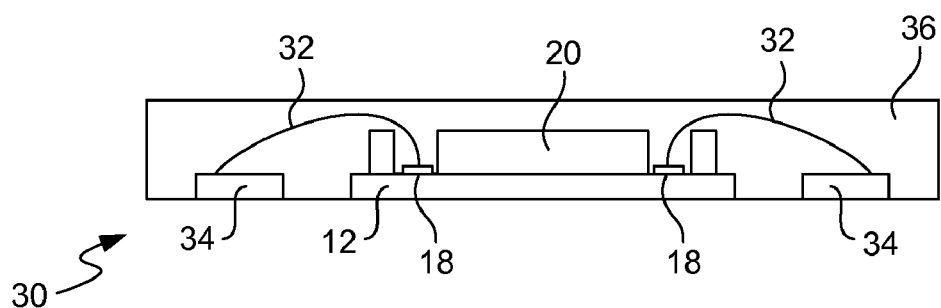
FIG. 5 is a cross section of a packaged die according to the present invention.

Referring to FIG. 5, a cross section of the die 12 in a semiconductor package 30 is shown. The package 30 includes the die 12 covered with the patterned film layer 20. Wire bonds 32 are formed between contacts 34 and the bond pads 18 on the active surface of the die 12. A molding compound 36 is used to encapsulate the package 30. Although not visible in the figure, the film layer 20 is provided between the thin film resistor 16 (not visible) on the active surface of the die 12 and the molding compound 36. The film layer 20 reduces stress buffering created by the molding compound 36.

Figure 6:
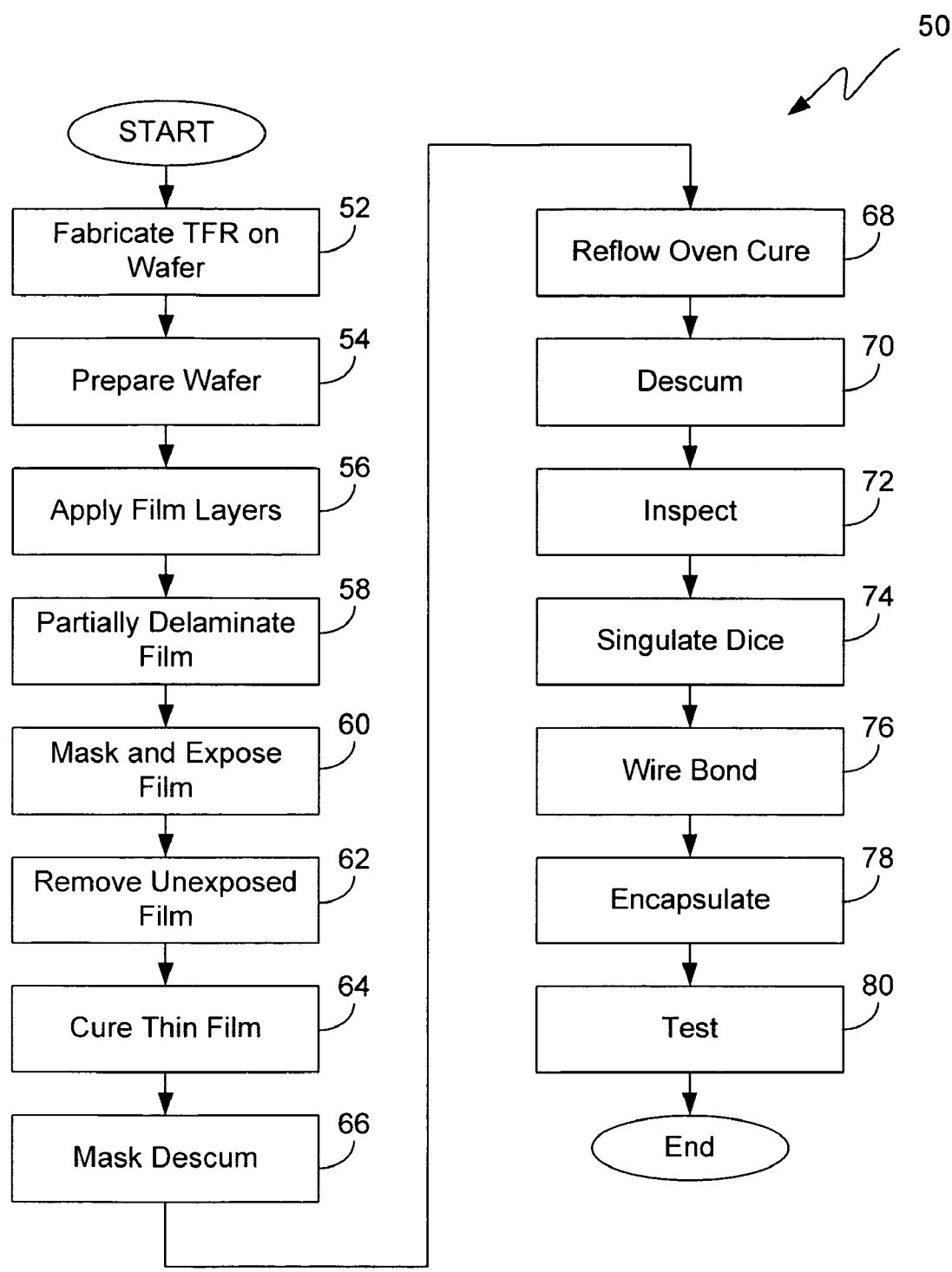
FIG. 6 is a flow diagram illustrating the process steps to fabricate the package of the present invention.

Referring to FIG. 6, a flow diagram 50 illustrating the process steps to fabricate the package 30 is shown. Initially (box 52), the wafer 10 is fabricated using standard semiconductor fabrication techniques. As previously noted, each die 12 includes one or more thin film resistors 16 and bond pads 18. The wafer 10 is prepared for the application of the thin film layer 20 (box 54) by removing surface contaminants. An adhesion promoter solvent, such as AP3000, is then applied to the active surface of the wafer 10. After the solvent is applied, the wafer is spun to evenly coat the adhesion promoter over the wafer surface. The film layer 20 is next applied to the wafer 10 (box 56). In various embodiments, the film layer 20 is a sheet of photo resist that is applied by laminating a resist film onto the wafer surface. A thin plastic film is laminated as a protective layer on the resist surface. The resist and the protective layer are laminated on the wafer while the wafer is placed on a heating element and heated to approximately 80 C. In a subsequent step (box 58), the protective film is delaminated, leaving only the film 20. The wafer 10 is then masked and exposed to UV light (box 60). The wafer 10 is then placed in a solvent to remove the masked portions of the resist film layer (box 62), creating the recess regions 22 and exposing the underlying bond pads. Since the masked regions are not exposed to UV light, these areas do not become polymerized and thus are removed by the solvent. The wafer 10 is placed in an N2 environment to evaporate any remaining solvent (box 64). The wafer 10 then undergoes a descum process (box 66) to remove any resist of the film layer 20 remaining on the bond pads 18. In a reflow oven cure (box 68), the wafer is subject to a heating process to further improve the adhesion between the wafer 10 and the film layer 20. In one embodiment, the wafer is elevated to 270 degrees C. The wafer again goes through another descum process (box 70) to remove any contaminants on the bond pads 18 that may be reintroduced during the reflow oven cure. Thereafter, the wafer is finally inspected (box 72). Wafers that pass inspection are then singulated (box 74) by sawing or cutting the wafer along the scribe lines 14. The individual die then undergo wire-bonding (74) and are encapsulated (box 78) in the molding compound 36. The package die 12 is again electrically tested (box 80) to complete the fabrication process.

In one embodiment, the film layer 20 is a dry film photopolymer such as Laminar® GA from Shipley, a Rohm and Haas Company. The Laminar® dry film photopolymer is an aqueous process-able dry film photoresist designed for alkaline and acid etch applications.

Although the foregoing invention has been described in some detail for purposes of clarity of understanding, it will be apparent that certain changes and modifications may be practiced within the scope of the appended claims. For example, the present invention may be used for any type of semiconductor package, such as but not limited to ball grid arrays, mini-small outline package (MSOP), small outline integrated circuit (SOIC) and transistor outline (TO) packages. Therefore, the described embodiments should be taken as illustrative and not restrictive, and the invention should not be limited to the details given herein but should be defined by the following claims and their full scope of equivalents.

We claim:

1. A method, comprising:
   fabricating a semiconductor die, the semiconductor die having thin film resistors and bond pads formed on an active surface of the die;
   forming a photo-resist film layer onto the active surface of the die, the photo-resist film layer covering the thin film resistors and bond pads formed on the active surface of the die;
   patterning the photo-resist film layer to create recesses in the film layer in the vicinity of the bond pads on the active surface of the die; and
   encapsulating the die in a molding compound, the photo-resist film layer reducing stress buffering on the thin film resistors caused by the molding compound.

2. The method of claim 1, further comprising applying a solvent to the die that enhances adhesion of the photo-resist film layer to the die prior to applying the photo-resist thin film to the die.

3. The method of claim 1, wherein the photo-resist film layer is patterned by:
   masking the photo-resist film layer on the die;
   exposed the die to UV radiation; and
   exposing the die to a solvent to remove the portions of the photo-resist film layer in the areas of the bond pads.

4. The method of claim 1, further comprising delaminating a portion of the photo-resist film layer formed on the active surface of the die prior to patterning the photo-resist film layer.

5. An apparatus, comprising:
   a semiconductor die having an active surface;
   a thin film resistor formed on the active surface of the semiconductor die;
   one or more bond pads formed on the active surface of the semiconductor die;
   a photo-resist film layer formed over the semiconductor die, the photo-resist film covering the thin film resistor formed on the active surface of the die; and
   a molding compound encapsulating the semiconductor die, the photo-resist film layer reducing stress buffering on the thin film resistor caused by the molding compound.

6. The apparatus of claim 5, wherein the photo-resist film layer is patterned to expose the one or more bond pads through the photo-resist film layer.

7. The apparatus of claim 6, further comprising one or more wire bonds electrically coupled to the one or more bond pads formed on the active surface of the semiconductor die.

8. The apparatus of claim 7, further comprising one or more leads electrically coupled to the one or more wire bonds, the one or more leads exposed on the outside surface of the mold compound used to encapsulate the semiconductor die.

9. A method, comprising:
   fabricating a plurality of dice on a wafer, the dice having thin film resistors and bond pads formed thereon;
   forming a photo-resist film layer over the dice of the wafer, the photo-resist film layer covering the thin film resistors on the dice;

dicing the wafer to singulate the individual dice of the wafer; and encapsulating the individual dice in a molding compound, the photo-resist film layer on each dice reducing stress buffering on the thin film resistor caused by the molding compound.

10. The method of claim 9, further comprising patterning the photo-resist film layer to expose the bond pads on the wafer prior to dicing the wafer.

11. The method of claim 10, wherein the patterning the photo-resist film layer further comprises:

masking the photo-resist film layer on the wafer;

exposing the wafer to UV radiation; and exposing the wafer to a solvent to remove the portions of the photo-resist film layer in the areas of the bond pads on the dice.

\* \* \* \* \*